United States Patent [19]

Imai et al.

[11] Patent Number: 5,499,601
[45] Date of Patent: Mar. 19, 1996

[54] METHOD FOR VAPOR PHASE SYNTHESIS OF DIAMOND

[75] Inventors: Takahiro Imai; Takashi Tsuno; Yoshiyuki Yamamoto; Naoji Fujimori, all of Itami, Japan

[73] Assignee: Sumitomo Electric Industries, Ltd., Osaka, Japan

[21] Appl. No.: 302,879

[22] PCT Filed: Jan. 13, 1994

[86] PCT No.: PCT/JP94/00035

§ 371 Date: Sep. 14, 1994

§ 102(e) Date: Sep. 14, 1994

[87] PCT Pub. No.: WO94/16125

PCT Pub. Date: Jul. 21, 1994

[30] Foreign Application Priority Data

Jan. 14, 1993 [JP] Japan .......................... 5-4704

[51] Int. Cl.⁶ .................................................. C30B 25/02
[52] U.S. Cl. ........................... 117/84; 117/921; 423/446
[58] Field of Search ........................... 117/1, 4, 79, 82, 117/84, 87, 921, 929; 423/446

[56] References Cited

U.S. PATENT DOCUMENTS 4,034,066  7/1977  Strong et al. ........................... 423/446

FOREIGN PATENT DOCUMENTS

| 63-224225 | 9/1988 | Japan . |
|---|---|---|
| 6442813 | 2/1989 | Japan . |
| 1138198 | 5/1989 | Japan . |
| 214897 | 1/1990 | Japan . |
| 218392 | 1/1990 | Japan . |
| 2233591 | 9/1990 | Japan . |
| 375298 | 3/1991 | Japan . |
| 4132687 | 5/1992 | Japan . |
| 4182391 | 6/1992 | Japan . |
| 8911897 | 12/1989 | WIPO . |
| 9201827 | 2/1992 | WIPO . |

OTHER PUBLICATIONS

Geis et al., "Large–Area Mosaic Diamond Films Approaching Single–Crystal Quality", Applied Physics Letter, vol. 58, No. 22, Jun. 3, 1991, pp. 2485–2487.
Lurie et al., "The Diamond Surface", Surface Science, vol. 65 (1977) pp. 453–475.
Patent Abstracts of Japan, vol. 15, No. 357 (C–0866), Oct. 24, 1989 & JP-A-03 141 193 (Fujitsu Ltd.) Jun. 17, 1991.
Narayan et al., "Enhancement of Nucleation and Adhesion of Diamond Films on Copper, Stainless Steel, and Silicon Substrates", Journal of Applied Physics, vol. 71, No. 2, Jan. 15, 1992, pp. 966–971.
Ramesham et al., "Selective Diamond Seed Deposition Using Elctroplated Copper", Diamond and Related Materials, vol. 1, No. 8, Jun. 25, 1992, pp. 907–910.

*Primary Examiner*—R. Bruce Breneman
*Assistant Examiner*—Felisa Garrett
*Attorney, Agent, or Firm*—Cushman Darby & Cushman

[57] ABSTRACT

Diamond particles are dispersed in a metal and the metal matrix is molten and recrystallized so that the diamond particles are aligned to the same crystal orientation to form a substrate equivalent to a diamond single crystal substrate and then the diamond is grown by a vapor phase synthesis on the substrate. The diamond single crystal having the homogeneity and good quality can be formed and the diamond single crystal having a large area can be easily and economically obtained.

7 Claims, 3 Drawing Sheets

METHOD FOR VAPOR PHASE SYNTHESIS OF DIAMOND

FIELD OF THE INVENTION

The present invention relates to a method for a vapor phase synthesis of diamond, particularly to a method for a vapor phase synthesis of a high-quality diamond crystal used for a cutting tool, an abrasion resistant tool, a precision tool, a semiconductor material, an electronic part, an optical part and the like.

RELATED ART

Since diamond has various excellent properties such as a high hardness, a high thermal conductivity and a good transparency, it is widely used as a material for various tools, an optical part, a semiconductor and an electronic part. The importance of the diamond seems to increase in feature.

In particular, when, among the above applications of the diamond, the diamond is used for a very precision tool, an optical part and a semiconductor in which a smooth abraded surface is needed or a highest level of the optical transparency or thermal conductivity is required, then a single crystal diamond or a diamond simple substance having a high crystal orientation must be used.

Hitherto, although a diamond film having a relatively large area has been artificially prepared on various substrates by a vapor phase synthesis, such diamond film is a polycrystal and a single crystal diamond film having a large area has not been prepared yet. Conditions for the epitaxial growth of the single crystal using the vapor phase synthesis have been studied and a method for preparing the single crystal having the large area by the vapor phase synthesis has been studied.

It has been known for a long time that a single crystal diamond layer can relatively easily grow through a homoepitaxial growth by using a diamond single crystal as a substrate in the diamond vapor phase synthesis. However, since a large diamond single crystal substrate which can act as a seed crystal has not been obtained, this method can give a single crystal having only a diameter of several millimeters. Various methods for the vapor phase synthesis have been proposed, since the vapor phase synthesis can easily give a homoepitaxial layer having a large area on the substrate if only a single crystal substrate having a large area is available.

Methods for growing the single crystal diamond having the large area by the vapor phase synthesis are generally classified into two classes of methods. The first class of methods utilizes a heteroepitaxial growth. Namely, the first class of methods is intended to give the single crystal having the large area by epitaxially growing the diamond layer on the single crystal substrate of a material which can give the large area single crystal substrate. For example, cubic boron nitride (cBN), silicon carbide, silicon, nickel, cobalt and the like have been reported as the substrate on which the diamond heteroepitaxially grows (cf. Japanese Patent Kokai Publication Nos. 224225/1988, 233591/1990 and 132687/1992).

However, a boron nitride cubic crystal which can be usually obtained has a size of only at most 0.5 mm, since a cubic boron nitride single crystal can be obtained with more difficulty than in the case of a diamond single crystal. Although a silicon carbide single crystal and a silicon single crystal having relatively large areas can be obtained, the diamond particles intend to have an orientation having no relationship with the orientation of the substrate so that it is difficult to obtain a large complete diamond single crystal. It is difficult to obtain a high-quality diamond single crystal by the use of nickel and cobalt, since nickel and cobalt not only have the same problems as in silicon carbide and silicon, but also they have the problem that the grown diamond reacts with nickel and cobalt to produce graphite.

Therefore, a second class of methods without the use of heteroepitaxy is considered. The second class of methods is a technique based on the growth of diamond on a diamond seed crystal, namely homoepitaxial growth. For example, the second class of methods includes a method which comprises shaping diamond single crystals in a constant shape, positioning the crystals in the state of the alignment of orientation, and then depositing a diamond single crystal thereon (Japanese Patent Kokai Publication No. 75298/1991), a method which comprises positioning, on a selectively etched Si substrate, particles having a size of about several 10 to 100 μm which are usually used as the abrasive particles, and growing diamond thereon (M. W. Geis, H. I. Smith, A. Argoitia, J. Angus, G. H. M. Ma, J. T. Glass, J. Butler, C. J. Robinson, R. Pryor, Appl. Phys. Lett., Vol. 58 (1991), page 2485) and the like.

When the epitaxial growth on the crystal substrate by the vapor phase deposition can be maintained in these methods, even if the grain boundary is present at the boundary of diamond layer which grows from an adjacent substrate single crystal, the grain boundary is a fine angular grain boundary for the purpose of obtaining a large area crystal having the properties in electrically and optically comparative to a single crystal. However, these methods suffer from the disadvantages that the cost for shaping the diamond single crystal in the constant shape is high, and that these methods may give a crystal having a significantly different orientation since the shapes of the seed crystal diamond particles are not constant.

When a diamond single crystal is grown by the vapor phase synthesis by using a natural or artificial diamond single crystal substrate as a nucleus, it is difficult to obtain the large natural or artificial diamond so that it is impossible to produce the diamond single crystal layer having the large area. Since the single crystal growth on the substrate of a different kind by the vapor phase synthesis suffers from the disadvantage that only the single crystal having many defects because of occurrence of distortion can be obtained, since a lattice constant and a thermal expansion coefficient are different between the diamond and the substrate. In the method for producing a large diamond single crystal or a large diamond simple substance having a high orientation by the use of one or at least two diamond substrates, there are disadvantages that the processing of the seed crystal substrate has a high cost and that it is impossible to align all orientations of diamond particles.

SUMMARY OF THE INVENTION

An object of the present invention is to solve the above problems and to synthesize a diamond single crystal or a high-orientation diamond simple substance by a vapor phase synthesis by using low-cost diamond abrasive grains as the seed crystals, fully aligning the seed crystal diamond grains and then depositing diamond.

The present invention provides a method for producing diamond by a vapor phase synthesis which comprises dispersing diamond particles in a matrix solid material having a melting point of at most 1,400° C., melting and recrystallizing the matrix solid material, if necessary, conducting a single crystallization of the matrix solid material due to the melting and recrystallization, removing a part of the matrix solid material to expose the diamond particles or conducting no such removal and then growing diamond through the vapor phase synthesis using the exposed diamond particles as the seed crystals.

DETAILED DESCRIPTION OF THE INVENTION

Figure 1:
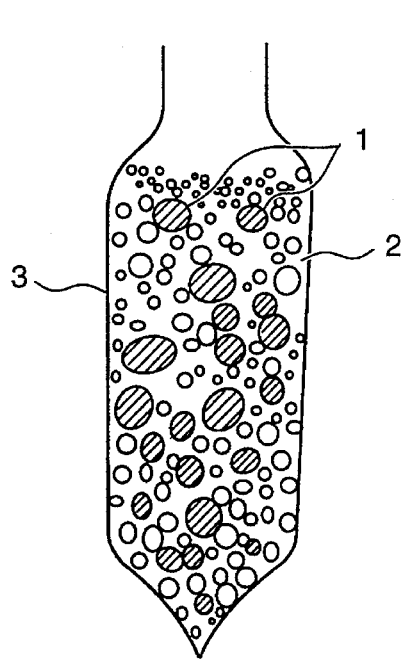
FIG. 1 shows a schematic cross-sectional view of a quartz tube which depicts a first step of the formation of a metal matrix having the dispersed diamond particles according to the present invention.

The inventors of the present application discovered that when the diamond particles are dispersed in the metal, and the metal is molten and then recrystallized, the diamond particles are positioned to have the same crystal orientation as the surrounding metal so that the diamond particles are strongly oriented in one crystal orientation. When such diamond particles are used as the seed crystals to conduct the growth of diamond by the vapor phase deposition, the diamond single crystal and the high-orientation diamond simple substance can be obtained.

Firstly, the diamond particles are dispersed in the metal matrix having the melting temperature of at most 1,400° C., and the metal matrix is molten and recrystallized at least once to give a diamond-metal matrix composite base material in which the crystal orientation of the diamond particles is the same as the crystal orientation of the metal matrix, in this case, depending on the recrystallization method, a composite base material having the metal matrix which is the single crystal can be obtained.

Then, by removing a part of the metal matrix of the composite base material or exposing a rupture surface or abraded surface, the oriented diamond particles are exposed on the composite base material. The diamond can be deposited by the vapor phase synthesis by the use of the seed crystals which are the exposed diamond particles. Since the grown diamond has the same crystal orientation as the crystal orientation of the seed crystals, pieces of diamond which grow from each of seed crystals and fuse to one another can have the single crystallinity or the strong orientation.

Several studies have been made on a contact interface between the metal and the diamond. Only recently, the epitaxial growth of diamond on a metal single crystal has been studied and the kind of the metal single crystal used as the substrate is limited. It have been increasingly known that it is difficult to deposit the diamond single crystal having the good quality.

However, it has been known hitherto that the epitaxial growth of the single crystals of various metals can be conducted by the vapor deposition and the like on the diamond single crystal (for example, P. G. Lurie, J. M. Wilson, Surface Science, Vol. 65 (1977) page 453 and Japanese Patent Kokai Publication No. 42813/1989). Examples of such metals includes Au, Ni, Cu, Si and the like. Easy growth of the metal single crystal on the diamond single crystal shows that the same crystal orientations of the metal and the diamond at the contact interface between the diamond crystal and the metal crystal have a more stable interface free energy.

The reason why it is difficult to form the diamond single crystal layer on the metal single crystal while the thin metal single crystal layer can be easily formed on the diamond single crystal is seemed to be that the crystal orientation of the diamond easily disorders since very vigorous reactions are performed in the vapor phase synthesis of diamond. The inventors of the present application thought that the alignment of crystal orientations of the diamond particles can be realized by utilizing the property that the orientations of the diamond crystal and the metal crystal can easily align in view of the energy.

Figure 2:
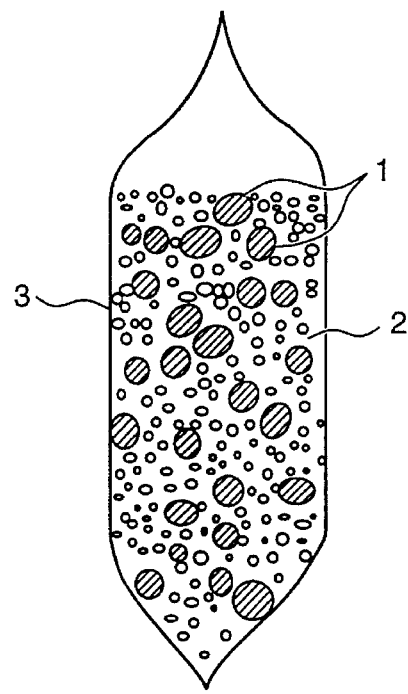
FIG. 2 shows a schematic cross-sectional view of a quartz tube which depicts a second step of the formation of a metal matrix having the dispersed diamond particles according to the present invention.
Figure 3:
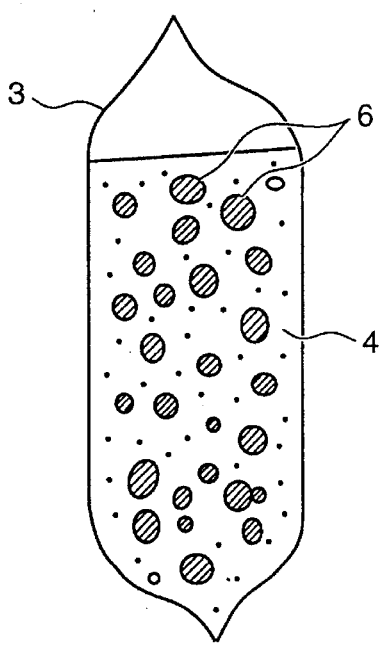
FIG. 3 shows a schematic cross-sectional view of a quartz tube which depicts a third step of the formation of a metal matrix having the dispersed diamond particles according to the present invention.
Figure 4:
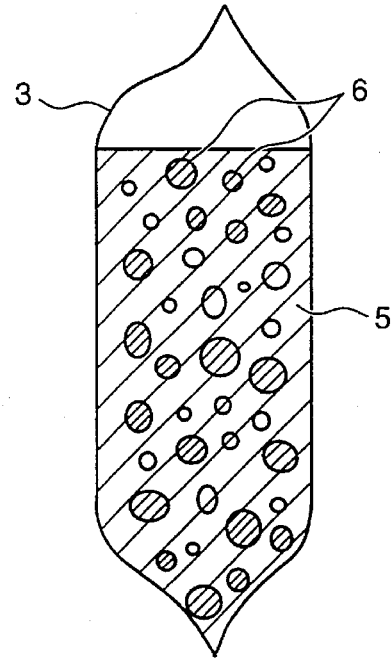
FIG. 4 shows a schematic cross-sectional view of a quartz tube which depicts a fourth step of the formation of a metal matrix having the dispersed diamond particles according to the present invention.

One example thereof is explained. The metal powder and the diamond powder are mixed and inserted in a quartz tube having one closed end (FIG. 1). After an oxide on the metal surface is reduced by the heating in a hydrogen stream, another end of the quartz tube is closed while vacuumizing the tube (FIG. 2). After the metal in the quartz tube containing the diamond and the metal is molten by Bridgman's method, the recrystallization is conducted to prepare a dispersion of the diamond particles in the metal crystal (FIG. 3). If the Bridgman's method can be ideally conducted, most parts of the metal forms one single crystal (FIG. 4).

If there is so sufficient time that the diamond particles can rotate to orient to the same orientation as the crystal orientation of the metal when the metal solidifies around the diamond particles, all of the diamond particles can orient to the same orientation as the metal crystal surrounding the diamond particles. The metal-diamond composite base material is cut along the crystal surface which is necessary for the diamond growth (FIG. 5) and a part of the metal is removed, for example, by an acid to expose the diamond particles (FIG. 6). When the diamond is grown by the vapor phase synthesis by using the exposed diamond particles as the seed crystals, the grown diamond can be a single crystal or a polycrystal having the aligned orientation because of the aligned orientations of seed crystals (FIG. 7).

In the present invention, the diamond particles dispersed in the metal usually have a particle size of 0.5 to 500 μm. If the size of the diamond particles is larger than 500 μm, it is undesirably difficult to give the same orientation of all diamond particles in the molten metal because the rotations of the diamond particles take much time. If the size is smaller than 0.5 μm, the diamond is easily dispersed in the state of carbon so that the diamond particles do not remain when metal is recrystallized. The preferable particle size of the diamond particles is from 1 to 80 μm.

In the present invention, the selection of the metal material used as the matrix is most important. The metal is a simple substance or an alloy. The metal should have the melting point of at most 1,400° C., since the diamond become graphite at about 1,400° C. The metal which strongly reacts with the carbon is undesirable, since it corrodes diamond. The metal element which reacts with the carbon to give a stable carbide nonsoluble in a metal liquid is also unsuitable.

In addition, the metal preferably has a crystal structure and a lattice constant similar to those of diamond, because the crystal orientations of the diamond and the metal can easily align. The metal may not have a diamond structure, but it preferably has a cubic crystal structure. It is not preferable to use an oxide having a melting point of at most 1,400° C. as the matrix, because the diamond suffers from the disadvantage that the diamond is oxidized to be corroded.

Typical metal elements are classified, as shown Table 1, according to the above properties which are necessary for the present invention. Among the metal elements, those satisfying the three preferable properties are only Cu and Ge. Actually, these two elements are most suitable as the metal matrix in the state of the simple substance. Cu has a face-centered cubic structure and has a lattice constant extremely similar to that of the diamond (+1% difference at a room temperature). Ge has a lattice constant different by at least 50% from that of the diamond, but a crystal structure of Ge is a diamond structure. Both have sufficiently low melting points and do not react with the diamond.

TABLE 1

| Properties | Metal element |
|---|---|
| Preferable properties | |
| Metal has a melting point of not higher than 1,400° C. | Ge, Sn, Pb, Mg, Ca, Hg, Al, Ga, In, Zn, Sr, Mn, Cu, Ag, Au, Ba, Bi, Sb |
| Metal does not react with carbon. In addition, metal does not form a stable carbide. | Ge, Sn, Pb, Mg, Ca, Ga, In, Zn, Cu, Ag, Au, Pt, Pd |
| Metal has a crystal structure or lattice constant similar to diamond. | Cu, Ni, Si, Ge |
| Undesirable properties | |
| Metal has a melting point of | B, Si, Ti, V, Cr, Fe, Co, Ni, Y, |

TABLE 1-continued

| Properties | Metal element |
|---|---|
| higher than 1,400° C. | Zr, Nb, Mo, La, Hf, Ta, W, Re, Ir, Pt |
| Metal reacts with carbon. Alternatively, metal forms a stable carbide. | B, Al, Si, Ti, V, Cr, Mn, Fe, Co, Ni, Zr, Nb, Mo, Hf, Ta, W |

In addition, the metal preferably has a specific gravity similar to that of the diamond, because the diamond has the specific gravity of 3.5 which is smaller than those of most metals so that the diamond particles floats on the molten metal to gather in the top of the molten metal. Because there is no metal in the state of the simple substance which has the same specific gravity as the diamond, it is necessary to prepare an alloy which has a specific gravity similar to the diamond. However, as described hereinafter, the specific gravity is not the problem to be considered, when the shape and procedure for melting the metal is improved.

As stated above, a material which easily reacts with the carbon is not preferable, because such material corrodes the diamond particles. But the metal which hardly reacts with the diamond suffers from the problems that such metal has poor wetness to the diamond and that the stabilization energy at the interface for aligning the crystal orientation of the diamond particles to the crystal orientation of the metal matrix is low.

The use of the alloy as the metal matrix material gives following advantages and it is most practical to use the alloy which is prepared depending on a process:

1. An energy at a interface between the diamond and the metal can be suitably adjusted.

2. A melting point can be adjusted.

3. A specific gravity can be adjusted.

As the metal matrix material, an alloy containing Cu, Ge or Si is more preferable than pure Cu or Ge. According to inventors' experiments, it is suitable to use an alloy containing at least 10% by atom of either one of Cu, Ge or Si, or an alloy containing at least 10% by atom of at least two selected from the group consisting of Cu, Ge and Si.

Since Cu or Ge hardly reacts with the carbon, it is suitable to add Si, Ni, B, Ti, V, Mn, Fe, Co, Zr, Nb, Mo, Hf, Ta and/or W in order to increase the wettability to the diamond. In order to decrease the wettability to the diamond, it is suitable to add Sn, Pb, Ga, In, Zn, Ag, Au, Pt and/or Pd. The amount of the metal improving the wettability is from 0 to 30% by atom, preferably from 0 to 5% by atom, based on the alloy.

In view of a lattice constant, it is most preferable to use an alloy containing Cu or Ni. Although Ni has a lattice constant most similar to that of the diamond near its melting point (1,453° C.), it has a high melting point and a high reactivity with the diamond so Ni alone is not practical. An alloy of Cu and Ni is very preferable, since it has a more similar lattice constant than Cu and the reactivity between the carbon and the alloy can be adjusted to a suitable level.

However, the alloy containing Ni may have the melting point higher than 1,400° C., since pure Ni has the melting point of 1,453° C. In order to keep the melting point of the alloy at not higher than 1,400° C. and to control the reaction, the alloy must contain at most 75% by atom of Ni. In the alloy, the amount of Ni is at most 75% by atom, preferably from 1 to 50% by atom. In the alloy, the amount of Cu is at least 25% by atom, preferably from 50 to 99% by atom. The alloy of Ni and Cu has a higher melting point than that of pure Cu (1,083° C.), but the melting point of the alloy can be decreased by adding an additional metal such as Ge, Si, In, Ga, Mn, Mg, P, Sb, Zn, Sn and the like. The amount of the additional metal is from 0 to 30% by atom, preferably from 0 to 5% by atom, based on the alloy.

The metals which have a smaller specific gravity than that of the diamond (3.5) are few and examples of such metal are Al, B, Be, Si, Mg, Ca, Li and the like. When the matrix having a specific gravity close to that of the diamond is used, it is necessary to prepare an alloy containing at least one of these metals. Among such alloys, an alloy of Si and Ge is most useful. Although the alloy containing from 60 to 70% by atom of Si has a specific gravity similar to the diamond, such alloy has a melting point of at least about 1,200° C. In order to decrease the melting point, it is suitable to add an additional metal such as Al, Ga, In, Pb, Sn, Au or the like. The amount of the additional metal is from 0 to 30% by atom, preferably from 0 to 10% by atom of the alloy.

Figure 8:
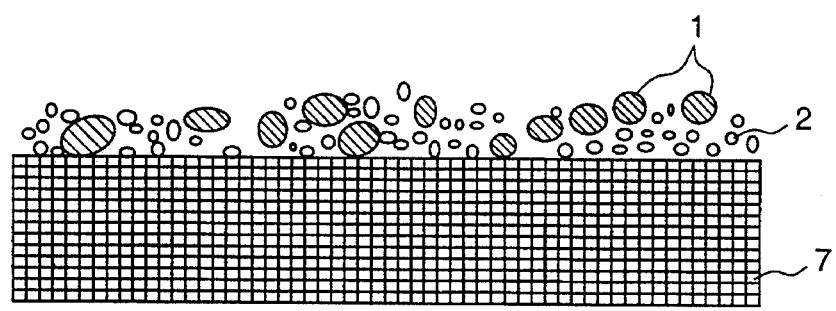
FIG. 8 shows a schematic cross-sectional view of a sample which depicts a first step of a vapor phase deposition of diamond with the use of a substrate according to the present invention.
Figure 11:
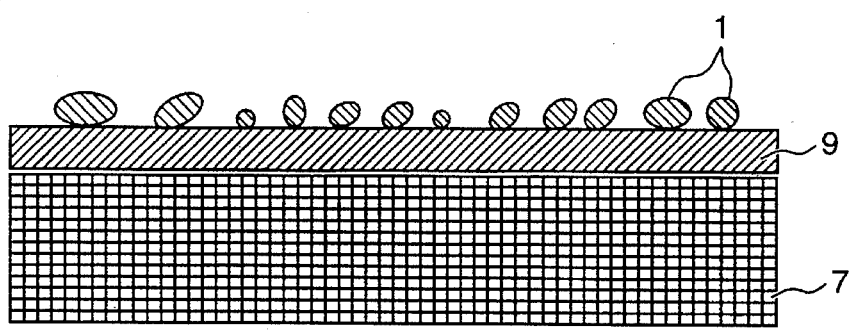
FIG. 11 shows a schematic cross-sectional view of a sample which depicts a deposition of diamond with the use of a substrate covered with a metal coating layer, according to the present invention.

However, the substrate (FIG. 9) equivalent to the substrate of FIG. 6 can be prepared without considering the difference of the specific gravity between the diamond and the matrix material, when the matrix material having the melting point of at most 1,400° C. and the diamond particles are mixed and positioned on the high melting point single crystal as in FIG. 8, or the metal layer having the melting point of at most 1,400° C. is previously formed on the high melting point single crystal and the diamond particles are positioned thereon as in FIG. 11 so that only the thin layer of the matrix material is molten. When a metal is previously coated on the diamond particles so as to increase the wettability to the matrix metal, the diamond particles are easily aligned to orient to the crystal orientation. The metal suitable for the coating is, for example, Ni, Al, Fe, Co, Mn, Cr, Si, Ti, Mo, W or the like. The thickness of the coating is usually from 0.01 to 10 μm, preferably from 0.1 to 10 μm. The coating can be prepared by a vapor phase deposition, a sputtering, an ion plating and the like.

Examples of the preferable metal for forming the matrix are as follows:

1) Cu;

2) Ge;

3) an alloy containing Cu (content of Cu: at least 5% by atom) (for example, Cu/Ni, Cu/Ni/Si, Cu/Ge/Si, Cu/Ni/Ga, Cu/Si, Cu/Ge, Cu/Ga, Cu/In, Cu/In/Si and the like);

4) an alloy containing Ge (content of Ge: at least 5% by atom) (for example, Ge/Si, Ge/Si/Al, Ge/Si/In, Ge/Si/Sn, Ge/Si/Ga);

5) an alloy containing Si (content of Si: from 5 to 95% by atom) (for example, Si/Al, Si/A! /Ga, Si/Au); and the like.

In addition, the In/Ni alloy can be also used. The metal forming the matrix has the melting point of at most 1,400° C., preferably from 300° to 1,200° C., most preferably from 600° to 1,100° C. The metal forming the matrix has the specific gravity of usually from 2.3 to 10.0, preferably from 2.6 to 9.0 at the room temperature.

The temperature for the melting is dependent on the melting point of the metal matrix and is usually from 200° to 1,400° C., preferably from 300° to 1,200° C.

The rate for cooling the matrix is preferably at most 10° C./min. It is more preferable to use cooling rate of at most 1° C./min in the temperature range of 25° C. above and below the melting point of the metal matrix. It is effective to keep the constant temperature for at least 10 minutes in the temperature range of 25° C. above and below the melting point of the metal matrix.

The vapor phase synthesis can be conducted by the conventional methods, for example, a thermal CVD method, a plasma CVD method, a combustion flame method, a plasma JET-CVD method, a laser CVD method and the like. During the vapor phase synthesis, the substrate may be kept at the temperature of at most 1,400° C., preferably from 600° to 1,100° C.

The present invention will be illustrated by taking the reference to the accompanied drawings.

FIGS. 1–4 show schematic cross-sectional views of a quartz which depicts a crystal preparation according to one embodiment of the present invention. As shown in FIG. 1, diamond particles I are mixed with metal powder 2 and charged in a quartz tube 3 having one closed end. As shown in FIG. 2, after an oxide on a metal surface is reduced by the heating in a hydrogen stream, a remainder end of the quartz tube 3 is closed while vacuumizing the tube. In FIG. 3, the oriented diamond particles 6 are dispersed in a molten and recrystallized metal matrix 4. The dispersion of the diamond particles in the metal crystal can be prepared by recrystallizing the metal after the metal in the quartz tube containing the diamond particles 1 and the metal powder 2 is molten, according to the Bridgman's method. FIG. 4 shows a single-crystallized metal matrix 5. When the Bridgman's method can be ideally conducted, the most parts of the metal forms one single crystal so that the single-crystallized metal matrix 5 is formed.

If necessary, the single-crystallization can be facilitated by positioning, as a seed crystal, a metal single crystal on a top or bottom of the quartz tube, so as to control the crystal orientation of the recrystallized metal matrix. The melting and recrystallization may be conducted by a pulling-up method other than Bridgman's method.

Figure 5:
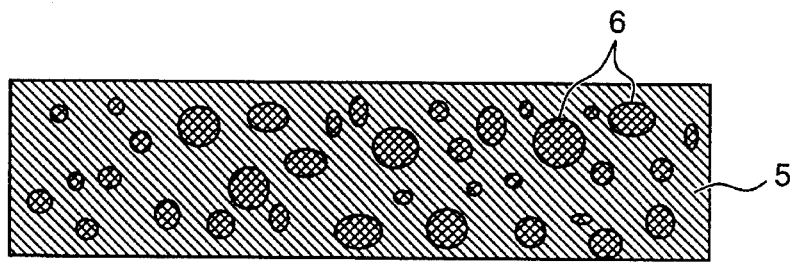
FIG. 5 shows a schematic cross-sectional view of a sample which depicts a first step of a vapor phase deposition of diamond according to the present invention.
Figure 6:
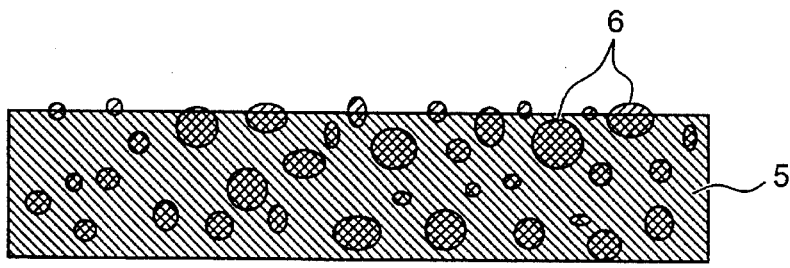
FIG. 6 shows a schematic cross-sectional view of a sample which depicts a second step of a vapor phase deposition of diamond according to the present invention.
Figure 7:
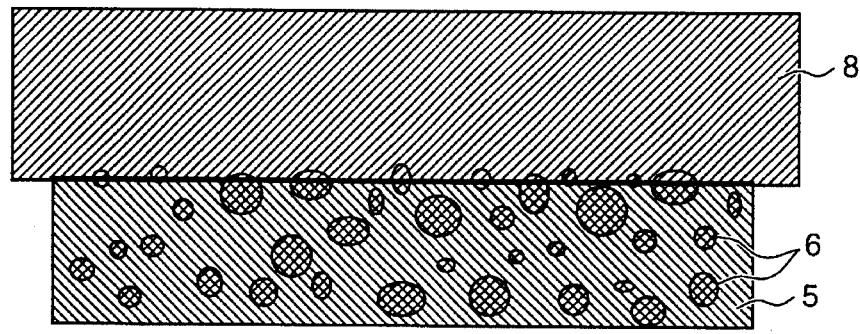
FIG. 7 shows a schematic cross-sectional view of a sample which depicts a third step of a vapor phase deposition of diamond according to the present invention.

FIGS. 5–7 show schematic cross-sectional views of a sample which depicts one embodiment of the present invention. As shown in FIG. 5, a resultant metal/diamond composite base material is cut along a crystal plane which is necessary for growing the diamond. As shown in FIG. 6, the diamond particles are exposed by removing a part of the metal at a surface, for example, by means of an acid. As shown in FIG. 7, the diamond is grown by using the exposed diamond particles as seed crystals by the vapor phase synthesis method. Since the seed crystals have the aligned crystal orientations, the grown diamond is a single crystal or a polycrystal having the aligned orientation.

Figure 9:
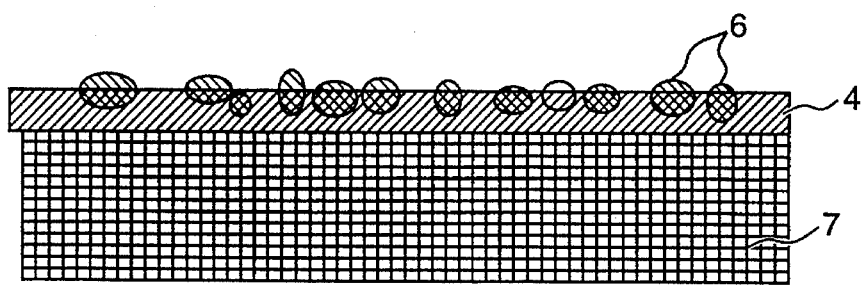
FIG. 9 shows a schematic cross-sectional view of a sample which depicts a second step of a vapor phase deposition of diamond with the use of a substrate according to the present invention.
Figure 10:
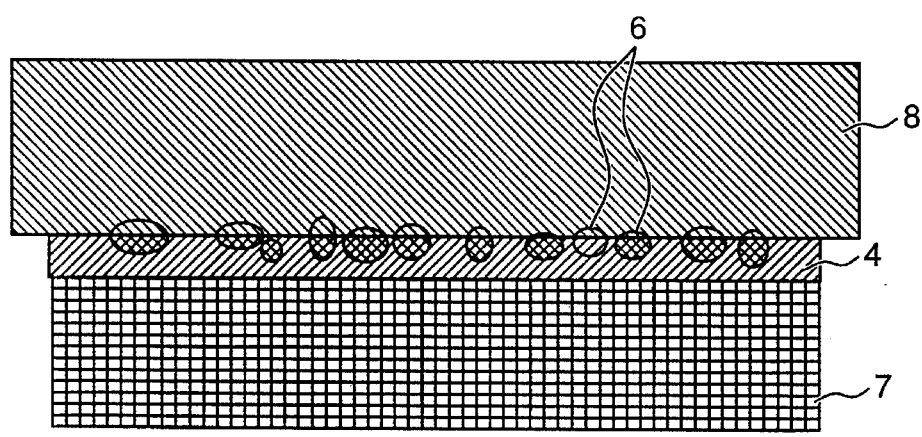
FIG. 10 shows a schematic cross-sectional view of a sample which depicts a third step of a vapor phase deposition of diamond with the use of a substrate according to the present invention.

FIGS. 8–10 show cross-sectional views of a sample which depicts a method using a substrate. As shown in FIG. 8, diamond particles 1 and metal powder 2 are positioned on a single crystal substrate 7 having a high melting point. As shown in FIG. 9, the crystallized metal matrix 4 and the oriented diamond particles 6 can be obtained by melting and crystallizing the metal powder 2. The metal preferably has a specific gravity larger than that of the diamond so that the diamond particles protrudes from the surface of the metal matrix. Then, as shown in FIG. 10, a diamond single crystal layer 8 is formed by the vapor phase synthesis. A material which is suitable as the substrate is a material which has a melting point higher than the metal matrix, for example, Mo, W, Ta, Si, SiC, SiN, $Al_2O_3$ and $SiO_2$. A difference between the melting points of the metal matrix and the substrate is preferably at least 100° C., more preferably at least 300° C.

FIG. 11 shows a cross-sectional view of a sample in which a surface of the high melting point single crystal substrate 7 is coated with a metal layer 9 by a vapor phase deposition. Diamond particles 1 are also shown. The metal layer 9 has a melting point of at most 1,400° C. and forms a metal matrix in which the diamond particles 1 are dispersed.

PREFERRED EMBODIMENT OF THE INVENTION

The present invention will be illustrated by the following Examples.

EXAMPLE 1

In a quartz tube having an internal diameter of 20 mm and one closed end, high purity Cu powder (200 g), Si powder (15 g), Ni powder (10 g) and diamond particles (1 g) having an average particle size of 12 μm were charged and intimately mixed (FIG. 1). After the mixture was treated at 700° C. for 1 hour in a hydrogen atmosphere, another end of the quartz tube was closed while vacuumizing the tube (FIG. 2). The quartz tube was inserted in an electrical oven and a whole thereof was heated to 1,100° C. during rotating the whole so as to conduct the melting. Then the tube was cooled to a room temperature over 16 hours (FIG. 3).

The molten and recrystallized crystal was observed to reveal that the whole of the metal parts was formed from five coarsened crystal grains. Using one crystal grain among five grains, a disk sample having a diameter of 6 mm and a thickness of 3 mm was cut by a discharge process so that a top plane of the grain forms a (100) plane of the alloy crystal grain (FIG. 5). A surface of the disk sample was etched with an acid (FIG. 6) and a diamond layer having a thickness of about 50 μm was grown by a known microwave plasma CVD method by using methane and hydrogen as the raw materials (FIG. 7). The diamond layer was analyzed by a X-ray powder diffraction method to reveal that a peak height ratio of the diffraction strength of (111) to (400) is 7 to 100 and that the diamond layer grows in the orientation of almost (100) plane.

EXAMPLE 2

As to the same sample molten and recrystallized in the quartz tube as in Example 1, the melting and the recrystallization were repeated twice so that a molten band portion moved from a bottom to a top by a band melting method. The temperature of the molten part was about 1,000° C. The removal of sample from the quartz tube revealed that the metal part as the whole forms a single crystal (FIG. 4). The analysis of the sample by the X-ray diffraction revealed that the diamond particles dispersed in the metal matrix have the same crystal orientation as the metal crystal.

A half-width of a X-ray locking curve of the diamond particles was measured at a (100) plane to be 1.7 degrees. In the same manner as in Example 1, a disk sample was prepared from the crystal, and the diamond was grown by the vapor phase synthesis to give the diamond which is deemed to be a single crystal as whole (FIG. 7). This diamond did not give a signal other than from a (400) plane by a X-ray powder diffraction method.

EXAMPLE 3

As in Example 2, in the quartz tube, high purity Si powder (50 g), Ge powder (100 g), Cu powder (5 g) and diamond particles having an average particle size of 30 μm (0.5 g) were charged. The band melting was repeated five times. The resultant orientation of the diamond particles in the metal crystal was 1.2 degrees at a (100) plane. In the same manner as in Example 1, a disk sample was prepared from the crystal, and diamond was grown by the vapor phase synthesis to give the diamond which is deemed to be a single crystal as whole. This diamond did not give a signal other than from a (400) plane by a X-ray powder diffraction method.

EXAMPLE 4

On a (100) plane of a cubic silicon carbide single crystal having a size of 15 mm square, the mixture particles of the metals and the diamond of Example 1 were positioned to prepare a sample A (FIG. 8). In addition, a layer of the same metals as in Example 1 having a thickness of 20 μm was deposited by the vapor deposition on the same silicon carbide single crystal and the diamond particles of Example 1 were positioned on the metal layer to prepare a sample B (FIG. 9). After both samples were heated to 1,100° C. to conduct the melting and the samples were kept at 850° C. for 10 hours, the samples were cooled to the room temperature over 5 hours. A diamond layer having a thickness of 120 μm was deposited by a known thermal filament CVD method on each of the samples. Each of these diamond layers was a single crystal as in Examples 2 and 3.

Effect of the Invention

Since the present invention can easily and economically give a diamond single crystal having a large area, a product can be suitably used for a cutting tool, an abrasive tool, a precision tool, a semiconductor material, an electronic part, an optical part and the like.

What is claimed is:

1. A method for producing diamond by a vapor phase synthesis which comprises dispersing diamond particles in a matrix solid material having a melting point of at most 1,400° C., melting and recrystallizing the matrix solid material, removing a part of the matrix solid material to expose the diamond particles and then growing diamond through the vapor phase synthesis using the exposed diamond particles as the seed crystals.

2. The method according to claim 1, wherein the matrix is Cu/Ni, Cu/Ni/Si, Cu/Ge/Si, Cu/Ni/Ga, Cu/Si, Cu/Ge, Cu/Ga, Cu/In or Cu/In/Si.

3. The method according to claim 1, wherein the matrix is Ge/Si, Ge/Si/Al, Ge/Si/In, Ge/Si/Sn or Ge/Si/Ga.

4. The method according to claim 1, wherein the matrix is Si/Al, Si/Al/Ga or Si/Au.

5. A method for producing diamond by a vapor phase synthesis which comprises dispersing diamond particles in a matrix solid material having a melting point of at most 1,400° C., melting and recrystallizing the matrix solid material to conduct a single crystallization of the matrix solid material, removing a part of the matrix solid material to expose the diamond particles and then growing diamond through the vapor phase synthesis using the exposed diamond particles as the seed crystals.

6. A method for producing a diamond single crystal by a vapor phase synthesis which comprises dispersing diamond particles on a matrix solid single crystal having a melting point of at most 1,400° C., melting and recrystallizing a surface part of the matrix solid single crystal, and then growing diamond through the vapor phase synthesis using the exposed diamond particles as the seed crystals.

7. A method for producing a diamond single crystal by a vapor phase synthesis which comprises positioning diamond particles and a matrix solid material on a single crystal material, melting and recrystallizing the matrix solid material to conduct a single crystallization of the matrix solid material, and then growing diamond through the vapor phase synthesis using the exposed diamond particles as the seed crystals.

* * * * *